(12) United States Patent
Lin

(10) Patent No.: US 12,176,874 B2
(45) Date of Patent: Dec. 24, 2024

(54) SIGNAL RECEIVING CIRCUIT AND NOISE FILTERING METHOD THEREOF

(71) Applicant: NANYA TECHNOLOGY CORPORATION, New Taipei (TW)

(72) Inventor: Shih-Ting Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 29 days.

(21) Appl. No.: 18/156,388

(22) Filed: Jan. 19, 2023

(65) Prior Publication Data

US 2024/0250663 A1 Jul. 25, 2024

(51) Int. Cl.
H03H 11/04 (2006.01)
H03F 3/45 (2006.01)

(52) U.S. Cl.
CPC ......... H03H 11/04 (2013.01); H03F 3/45475 (2013.01)

(58) Field of Classification Search
CPC . H03H 11/04; H03F 3/45475; H03F 3/45968; H03F 3/45744; H03F 2200/372; H03F 2203/45354; H03F 3/45596
See application file for complete search history.

(56) References Cited

U.S. PATENT DOCUMENTS

| 2014/0340789 | A1  | 11/2014 | Miura |
|---|---|---|---|
| 2017/0111735 | A1  | 4/2017  | Ego |
| 2022/0321811 | A1* | 10/2022 | Myers ................. H03F 3/45475 |

FOREIGN PATENT DOCUMENTS

| TW | I656730   | 4/2019 |
| TW | 202249418 | 12/2022 |
| WO | 2022174403 | 8/2022 |

OTHER PUBLICATIONS

"Office Action of Taiwan Counterpart Application", issued on Apr. 24, 2024, p. 1-p. 8.
"Office Action of Taiwan Counterpart Application", issued on Sep. 11, 2023, p. 1-p. 5.

* cited by examiner

Primary Examiner — Jung Kim
(74) Attorney, Agent, or Firm — JCIPRNET

(57) ABSTRACT

A signal receiving circuit and a noise filtering method thereof are provided. The signal receiving circuit includes an operational amplifier circuit and a voltage offset adjustment circuit. A first input terminal and a second input terminal of the operational amplifier circuit receive a differential signal, a third input terminal receives a reference voltage, and the operational amplifier circuit compares the differential signal with the reference voltage to generate an output signal. The voltage offset adjustment circuit is coupled to the third input terminal of the operational amplifier circuit, and provides an offset voltage to adjust the reference voltage.

10 Claims, 3 Drawing Sheets

SIGNAL RECEIVING CIRCUIT AND NOISE FILTERING METHOD THEREOF

BACKGROUND

Technical Field

The disclosure relates to an electronic circuit, and in particular, to a signal receiving circuit and a noise filtering method thereof.

Description of Related Art

With the advancement of technology, dynamic random access memory (DRAM) tends to become smaller and faster. When the signal rate becomes higher, in order to reduce the transition time and power consumption of the signal, the amplitude of the signal is generally reduced accordingly. However, this makes the signal less tolerant to noise. In the field of the dynamic random access memory, the situation causes the data signal to be easily misjudged, thereby causing the DRAM to receive the wrong data.

SUMMARY

The disclosure provides a signal receiving circuit and a noise filtering method thereof, which may effectively filter out noise and avoid signal misjudgment.

The signal receiving circuit of the disclosure includes an operational amplifier circuit and a voltage offset adjustment circuit. The operational amplifier circuit has a first input terminal, a second input terminal, and a third input terminal. The first input terminal and the second input terminal of the operational amplifier circuit receive a differential signal, the third input terminal of the operational amplifier circuit receives a reference voltage, and the operational amplifier circuit compares the differential signal with the reference voltage to generate an output signal. The voltage offset adjustment circuit is coupled to the third input terminal of the operational amplifier circuit, and the voltage offset adjustment circuit provides an offset voltage to adjust the reference voltage.

In an embodiment of the disclosure, the above-mentioned voltage offset adjustment circuit provides the offset voltage according to the noise of the differential signal.

In an embodiment of the disclosure, the above-mentioned voltage offset adjustment circuit provides the offset voltage according to the amplitude range of the differential signal affected by noise.

In an embodiment of the disclosure, the above-mentioned operational amplifier circuit further has a first power supply terminal and a second power supply terminal. The first power supply terminal is used to receive the first power supply voltage, and the second power supply terminal is used to receive the second power supply voltage.

In an embodiment of the disclosure, the above-mentioned first power supply voltage is greater than the second power supply voltage, and the second power supply voltage is a ground voltage.

The disclosure also provides a noise filtering method of a signal receiving circuit, and the signal receiving circuit includes an operational amplifier circuit having a first input terminal, a second input terminal, and a third input terminal. The first input terminal and the second input terminal of the operational amplifier circuit receives a differential signal, and the third input terminal of the operational amplifier circuit receives a reference voltage. The noise filtering method of the signal receiving circuit includes the following steps. A voltage offset adjustment circuit is provided. The voltage offset adjustment circuit is controlled to provide an offset voltage to the third input terminal of the operational amplifier circuit so as to adjust the reference voltage.

In an embodiment of the disclosure, the above-mentioned noise filtering method of the signal receiving circuit includes controlling the voltage offset adjustment circuit to provide the offset voltage according to the noise of the differential signal.

In an embodiment of the disclosure, the above-mentioned noise filtering method of the signal receiving circuit includes controlling the voltage offset adjustment circuit to provide the offset voltage according to the amplitude range of the differential signal affected by the noise.

In an embodiment of the disclosure, the above-mentioned operational amplifier circuit further has a first power supply terminal and a second power supply terminal. The first power supply terminal is used to receive the first power supply voltage, and the second power supply terminal is used to receive the second power supply voltage.

In an embodiment of the disclosure, the above-mentioned first power supply voltage is greater than the second power supply voltage, and the second power supply voltage is a ground voltage.

Based on the above, the operational amplifier circuit of the embodiment of the disclosure may compare the differential signal with the reference voltage to generate an output signal, and adjust the reference voltage through the offset voltage provided by the voltage offset adjustment circuit, which may effectively filter out noise and avoid signal misjudgment.

In order to make the above-mentioned features and advantages of the disclosure clearer and easier to understand, the following specific embodiments are described in detail together with the accompanying drawings.

DESCRIPTION OF THE EMBODIMENTS

Figure 1:
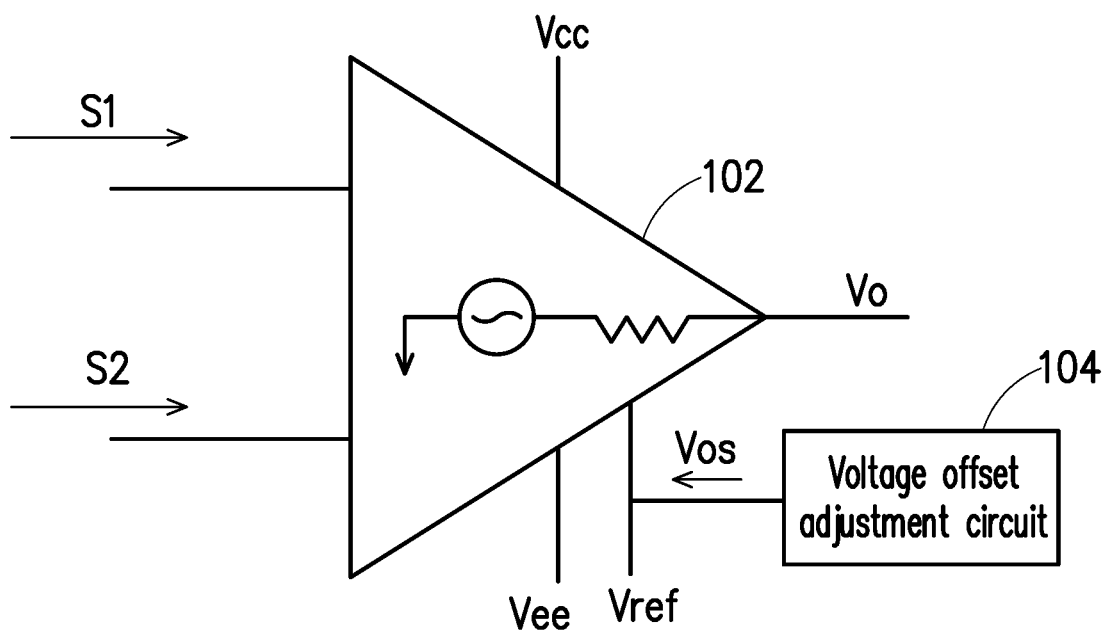
FIG. 1 is a schematic diagram of a signal receiving circuit according to an embodiment of the disclosure.

FIG. 1 is a schematic diagram of a signal receiving circuit according to an embodiment of the disclosure. Please refer to FIG. 1. The signal receiving circuit may include an operational amplifier circuit 102 and a voltage offset adjustment circuit 104. The operational amplifier circuit 102 has a first input terminal, a second input terminal, a third input terminal, an output terminal, a first power supply terminal, and a second power supply terminal. The first input terminal and the second input terminal of the operational amplifier circuit 102 are used to receive a differential signal, and the third input terminal of the operational amplifier circuit 102 is coupled to a reference voltage Vref. The differential signal may include an input signal S1 and an input signal S2 with opposite phases. The first power supply terminal and the second power supply terminal of the operational amplifier circuit 102 are respectively coupled to a first power supply voltage Vcc and a second power supply voltage Vee. The first power supply voltage Vcc is greater than the second power supply voltage Vee, and the second power supply voltage Vee may be, for example, a ground voltage, but is not limited thereto. The voltage offset adjustment circuit 104 is coupled to the third input terminal of the operational amplifier circuit 102.

Figure 2A:
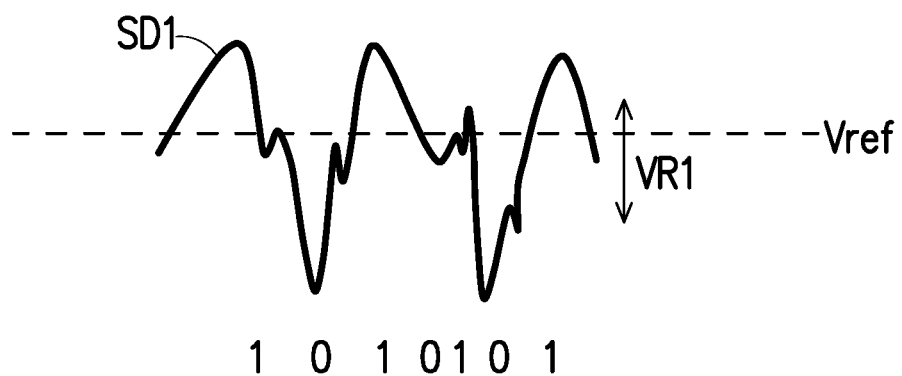
FIG. 2A and FIG. 2B are schematic signal waveform diagrams of a signal receiving circuit according to an embodiment of the disclosure.

The operational amplifier circuit 102 may compare the differential signal with the reference voltage Vref to generate an output signal Vo. For example, as shown in FIG. 2A, a differential signal SD1 may be obtained by subtracting the input signal S2 from the input signal S1, and the operational amplifier circuit 102 may generate the output signal Vo according to the comparison result of the differential signal SD1 and the reference voltage Vref. For example, when the voltage value of the differential signal SD1 is higher than or equal to the voltage value of the reference voltage Vref, the signal value of the output signal Vo of the operational amplifier circuit 102 is "1" (for example, the output signal Vo of the operational amplifier circuit 102 is a high logic level), and when the voltage value of the differential signal SD1 is lower than the voltage value of the reference voltage Vref, the signal value of the output signal Vo of the operational amplifier circuit 102 is "0" (for example, the output signal Vo of the operational amplifier circuit 102 is a low logic level). In the embodiment of FIG. 2A, the data transmitted by the differential signal SD1 was originally "10101", but due to the noise interference, the waveform of the differential signal SD1 changes, which in turn causes the signal value of the output signal Vo generated by the operational amplifier circuit 102 to be "1010101" according to the comparison result of the differential signal SD1 and the reference voltage Vref.

Figure 2B:
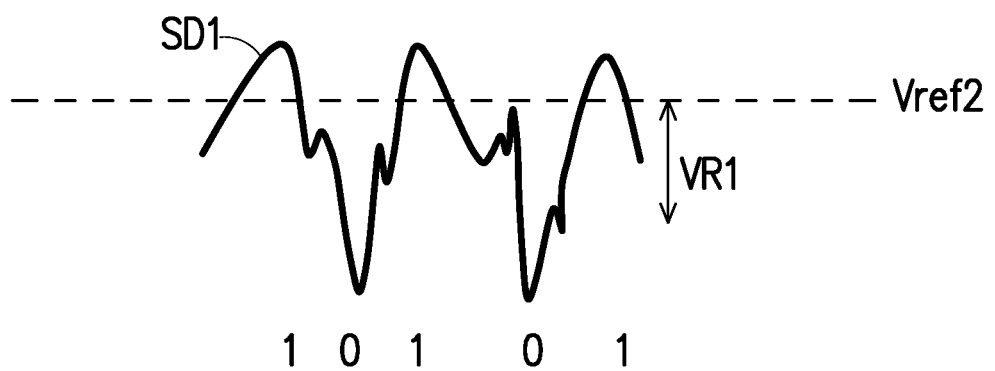

To avoid this situation, the operational amplifier circuit 102 may control the voltage offset adjustment circuit 104 to provide an offset voltage Vos to the third input terminal of the operational amplifier circuit 102 to change the voltage value of the reference voltage Vref. The operational amplifier circuit 102 may control the voltage offset adjustment circuit 104 to provide the offset voltage Vos according to the noise of the differential signal SD1. For example, the offset voltage Vos is provided according to an amplitude range VR1 of the differential signal SD1 affected by the noise. For example, in the embodiment of FIG. 2B, in order to avoid the signal value error of the output signal Vo in the embodiment of FIG. 2A, the operational amplifier circuit 102 may control the voltage offset adjustment circuit 104 to provide the offset voltage Vos, so as to increase the voltage value of the reference voltage Vref to a reference voltage Vref2. As shown in FIG. 2B, since the voltage value of the reference voltage Vref2 has deviated from the amplitude range VR1 where the differential signal SD1 is affected by noise, the signal value of the output signal Vo generated by the operational amplifier circuit 102 is the correct "10101" according to the comparison result of the differential signal SD1 and the reference voltage Vref. In this way, adjusting the reference voltage Vref through the offset voltage Vos provided by the voltage offset adjustment circuit 104 may effectively remove the influence of noise and avoid misjudgment of signal values.

It should be noted that, in the embodiment of FIG. 2B, the operational amplifier circuit 102 provides the offset voltage Vos to control the voltage offset adjustment circuit 104, so as to increase the voltage value of the reference voltage Vref to the reference voltage Vref2, but in other embodiments, the operational amplifier circuit 102 may also control the voltage offset adjustment circuit 104 to provide the offset voltage Vos, so as to reduce the voltage value of the reference voltage Vref, so that the reference voltage Vref deviates from the amplitude range VR1 where the differential signal SD1 is affected by noise. That is to say, the adjustment method of the reference voltage Vref is not limited to the embodiment shown in FIG. 2B. In actual application, the voltage value of the reference voltage Vref may be raised or lowered according to requirements, so as to effectively filter out noise and avoid misjudgment of signal values. In other embodiments, the operational amplifier circuit 102 may also control the voltage offset adjustment circuit 104 to provide the offset voltage Vos, so as to increase the voltage value of the reference voltage Vref or decrease the preset voltage value, and reduce the occurrence of misjudgment of signal values.

Figure 3:
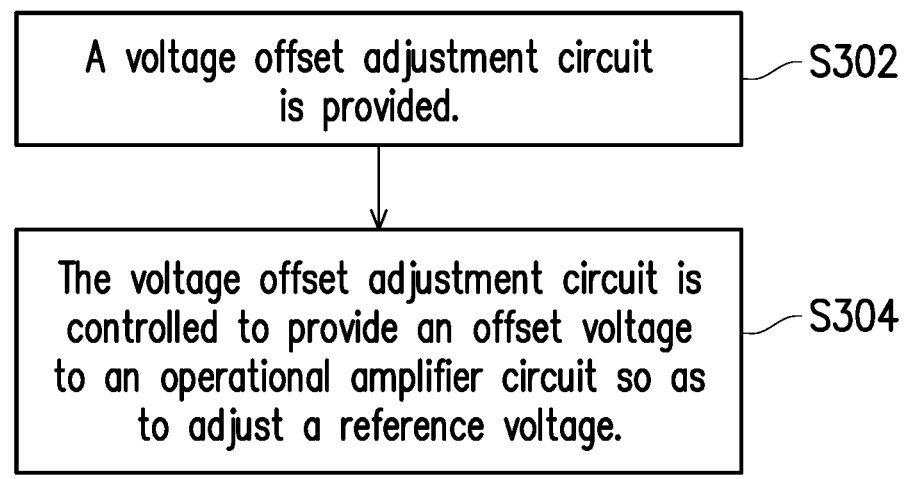
FIG. 3 is a flow diagram of a noise filtering method of a signal receiving circuit according to an embodiment of the disclosure.

FIG. 3 is a flow diagram of a noise filtering method of a signal receiving circuit according to an embodiment of the disclosure. The signal receiving circuit includes an operational amplifier circuit having a first input terminal, a second input terminal, a third input terminal, an output terminal, a first power supply terminal, and a second power supply terminal. The first input terminal and the second input terminal of the operational amplifier circuit receive a differential signal, the third input terminal of the operational amplifier circuit receives a reference voltage. The first power supply terminal and the second power supply terminal of the operational amplifier circuit are respectively coupled to a first power supply voltage and a second power supply voltage. The first power supply voltage is greater than the second power supply voltage, and the second power supply voltage may be, for example, a ground voltage, but is not limited thereto. It may be seen from the above embodiments that the noise filtering method of the signal receiving circuit may include the following steps. First, a voltage offset adjustment circuit (step S402) is provided. Then, the voltage offset adjustment circuit is controlled to provide an offset voltage to the third input terminal of the operational amplifier circuit so as to adjust the reference voltage (step S404). The offset voltage may be provided according to the noise control voltage offset adjustment circuit of the differential signal. For example, the offset voltage may be provided according to the amplitude range of the differential signal affected by the noise, so that the reference voltage may be separated from the amplitude range of the differential signal affected by the noise, thereby effectively filtering out noise and avoiding misjudgment of signal values.

To sum up, the operational amplifier circuit of the embodiment of the disclosure may compare the differential signal with the reference voltage to generate an output signal, and adjust the reference voltage through the offset voltage provided by the voltage offset adjustment circuit, which may effectively filter out noise and avoid signal misjudgment.

What is claimed is:

1. A signal receiving circuit, comprising:
   an operational amplifier circuit, having a first input terminal, a second input terminal, and a third input terminal, wherein the first input terminal and the second input terminal of the operational amplifier circuit receive a differential signal, the third input terminal of the operational amplifier circuit receives a reference voltage, and the operational amplifier circuit compares the differential signal with the reference voltage to generate an output signal; and
   a voltage offset adjustment circuit, coupled to the third input terminal of the operational amplifier circuit, wherein the voltage offset adjustment circuit provides an offset voltage to adjust the reference voltage according to whether the number of bits of data of the differential signal is the same as the number of bits of data of the output signal.

2. The signal receiving circuit according to claim 1, wherein the voltage offset adjustment circuit provides the offset voltage according to a noise of the differential signal.

3. The signal receiving circuit according to claim 2, wherein the voltage offset adjustment circuit provides the offset voltage according to an amplitude range of the differential signal affected by the noise.

4. The signal receiving circuit according to claim 1, wherein the operational amplifier circuit also has a first power supply terminal and a second power supply terminal, the first power supply terminal is used to receive a first power supply voltage, and the second power supply terminal is used to receive a second power supply voltage.

5. The signal receiving circuit according to claim 4, wherein the first power supply voltage is greater than the second power supply voltage, and the second power supply voltage is a ground voltage.

6. A noise filtering method of a signal receiving circuit, wherein the signal receiving circuit comprises an operational amplifier circuit having a first input terminal, a second input terminal, and a third input terminal, the first input terminal and the second input terminal of the operational amplifier circuit receive a differential signal, the third input terminal of the operational amplifier circuit receives a reference voltage, the operational amplifier circuit compares the differential signal with the reference voltage to generate an output signal and the noise filtering method of the signal receiving circuit comprises:

providing a voltage offset adjustment circuit; and
controlling the voltage offset adjustment circuit to provide an offset voltage to the third input terminal of the operational amplifier circuit to adjust the reference voltage according to whether the number of bits of data of the differential signal is the same as the number of bits of data of the output signal.

7. The noise filtering method of the signal receiving circuit according to claim 6, comprising:
controlling the voltage offset adjustment circuit to provide the offset voltage according to a noise of the differential signal.

8. The noise filtering method of the signal receiving circuit according to claim 7, comprising:
controlling the voltage offset adjustment circuit to provide the offset voltage according to an amplitude range of the differential signal affected by the noise.

9. The noise filtering method of the signal receiving circuit according to claim 6, wherein the operational amplifier circuit also has a first power supply terminal and a second power supply terminal, the first power supply terminal is used to receive a first power supply voltage, and the second power supply terminal is used to receive a second power supply voltage.

10. The noise filtering method of the signal receiving circuit according to claim 9, wherein the first power supply voltage is greater than the second power supply voltage, and the second power supply voltage is a ground voltage.

* * * * *